United States Patent
Lee et al.

(10) Patent No.: US 8,283,868 B2
(45) Date of Patent: Oct. 9, 2012

(54) LED LIGHT ENGINE

(75) Inventors: George Lee, Rowland Heights, CA (US); Arthur Young, Walnut, CA (US); John Yang, Arcadia, CA (US)

(73) Assignee: American Bright Lighting, Inc., Chino, CA (US)

( * ) Notice: Subject to any disclaimer, the term of this patent is extended or adjusted under 35 U.S.C. 154(b) by 408 days.

(21) Appl. No.: 12/545,613

(22) Filed: Aug. 21, 2009

(65) Prior Publication Data

US 2010/0045198 A1   Feb. 25, 2010

Related U.S. Application Data

(60) Provisional application No. 61/189,648, filed on Aug. 21, 2008, provisional application No. 61/095,250, filed on Sep. 8, 2008.

(51) Int. Cl.
*H01J 13/32* (2006.01)

(52) U.S. Cl. .......... 315/118; 315/50; 315/117; 315/247; 315/250

(58) Field of Classification Search .................... 315/32, 315/50, 112, 117–118, 246–247, 250; 362/382
See application file for complete search history.

(56) References Cited

U.S. PATENT DOCUMENTS

| | | | |
|---|---|---|---|
| 5,661,645 A | 8/1997 | Hochstein | |
| 5,936,599 A * | 8/1999 | Reymond | 345/82 |
| 6,283,612 B1 * | 9/2001 | Hunter | 362/240 |
| 6,536,924 B2 | 3/2003 | Segretto | |
| 6,726,341 B2 | 4/2004 | Pashley et al. | |
| 6,758,573 B1 | 7/2004 | Thomas et al. | |
| 7,318,661 B2 * | 1/2008 | Catalano | 362/297 |
| 7,378,805 B2 * | 5/2008 | Oh et al. | 315/291 |
| 2002/0158590 A1 | 10/2002 | Saito | |
| 2003/0112627 A1 * | 6/2003 | Deese | 362/249 |
| 2003/0189829 A1 * | 10/2003 | Shimizu et al. | 362/240 |
| 2005/0068770 A1 * | 3/2005 | Sloan et al. | 362/227 |
| 2005/0156536 A1 | 7/2005 | Ball | |
| 2006/0082330 A1 * | 4/2006 | Montante | 315/291 |
| 2006/0083038 A1 | 4/2006 | Lynch | |
| 2006/0192728 A1 | 8/2006 | Kim | |
| 2006/0284728 A1 * | 12/2006 | Rubinstein et al. | 340/310.12 |
| 2007/0030678 A1 | 2/2007 | Bedson et al. | |
| 2007/0158668 A1 | 7/2007 | Tarsa et al. | |

(Continued)

FOREIGN PATENT DOCUMENTS

CN   1722927 A   1/2006

(Continued)

OTHER PUBLICATIONS

Notification of the Transmittal of the International Search Report and The Written Opinion of the International Searching Authority, International Search Report (date mailed Oct. 20, 009) and Written Opinion of the International Searching Authority for PCT/US09/054642, filed on Aug. 21, 2009.

(Continued)

*Primary Examiner* — Jason M Crawford
(74) *Attorney, Agent, or Firm* — Vic Lin; Innovation Capital Law Group, LLP

(57) ABSTRACT

An integrated Light Emitting Diode (LED) device including multiple LEDs connected to a circuit board, integrated circuit (IC) drivers connected to the circuit board, and a first alternating current (AC) terminal and a second AC terminal connected to the circuit board.

19 Claims, 4 Drawing Sheets

U.S. PATENT DOCUMENTS

2007/0188112 A1    8/2007  Kang et al.
2010/0195322 A1*   8/2010  Kawakami et al. ........... 362/231

FOREIGN PATENT DOCUMENTS

DE      4202776 A1    8/1993
FR      2891106 A1    3/2007

OTHER PUBLICATIONS

European Search Report dated Jan. 20, 2012 for European Patent Application No. 08742465.1, filed on Oct. 7, 2009.

Notification of Transmittal of the International Search Report and the Written Opinion of the International Searching Authority (Mailing Date Dec. 15, 2011) for International PCT Patent Application No. PCT/US2011/048952, Filed on Aug. 24, 2011.

Notification of the Transmittal of the International Search Report and The Written Opinion of the International Searching Authority, International Search Report (date mailed Jul. 29, 2009) and Written Opinion of the International Searching Authority for PCT/US08/04255, filed on Apr. 1, 2008.

* cited by examiner

LED LIGHT ENGINE

CROSS-REFERENCES TO RELATED APPLICATIONS

This application claims the benefit of U.S. Provisional Application No. 61/189,648, filed Aug. 21, 2008, and U.S. Provisional Application No. 61/095,250, filed Sep. 8, 2008, all of which are incorporated herein by reference.

BACKGROUND

1. Field of the Invention

The present invention relates generally to Light Emitting Diode (LED) lighting, more particularly, to LED light engines.

2. Description of the Related Art

For solid state lighting, there are three main components of a luminary: LEDs, the driving circuitry, and the housing. In most cases, a designer would have to select LEDs, come up with driving circuitry, and design the circuit board for placing the assembly.

There are very few offerings of LED modules for lighting designers to just integrate into a housing to see if it fits the intended application. Of the few LED modules, they still require external driving circuitry. An issue with using direct Alternating Current (AC) is that the total harmonic distortion of current (THDi) is high. Most energy programs require total THDi to be lower than 20% to qualify.

BRIEF SUMMARY

One aspect of an embodiment of the invention includes an integrated Light Emitting Diode (LED) device including multiple LEDs connected to a circuit board, integrated circuit (IC) drivers connected to the circuit board, and a first alternating current (AC) terminal and a second AC terminal connected to the circuit board.

Another aspect of an embodiment of the invention provides an LED system comprising a plurality of integrated circuit (IC) boards coupled to one another, each of the plurality of IC boards comprising: a plurality of LEDs coupled to each IC board, a plurality of LED IC drivers coupled to each IC board, and a first pair of alternating current (AC) terminals and a second pair of AC terminals coupled to each IC board. A second pair of AC terminals of a first IC board couples with a first pair of AC terminals of a second IC board.

Yet another aspect of an embodiment of the invention provides an LED driving method comprising: providing a circuit board, integrating a plurality of LEDs to the circuit board, integrating a plurality of LED integrated circuit (IC) driver circuits with the circuit board, wire bonding the LEDs and the LED IC driver circuits, and coupling the circuit board to an AC line voltage source.

Other aspects and advantages of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

For a fuller understanding of the nature and advantages of the invention, as well as a preferred mode of use, reference should be made to the following detailed description read in conjunction with the accompanying drawings, in which.

DETAILED DESCRIPTION

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc. The description may disclose several preferred embodiments for Light Emitting Diode (LED) chip-on-board (COB) and driver integrated circuit modules, devices, and methods, as well as operation and/or component parts thereof. While the following description will be described in terms of integrated LED light driver integrated circuit devices, systems and methods for clarity and placing the invention in context, it should be kept in mind that the teachings herein may have broad application to all types of systems, devices and applications.

One embodiment of the invention includes an integrated Light Emitting Diode (LED) device including multiple LEDs connected to a circuit board, integrated circuit (IC) drivers connected to the circuit board, and a first alternating current (AC) terminal and a second AC terminal connected to the circuit board.

Figure 1:
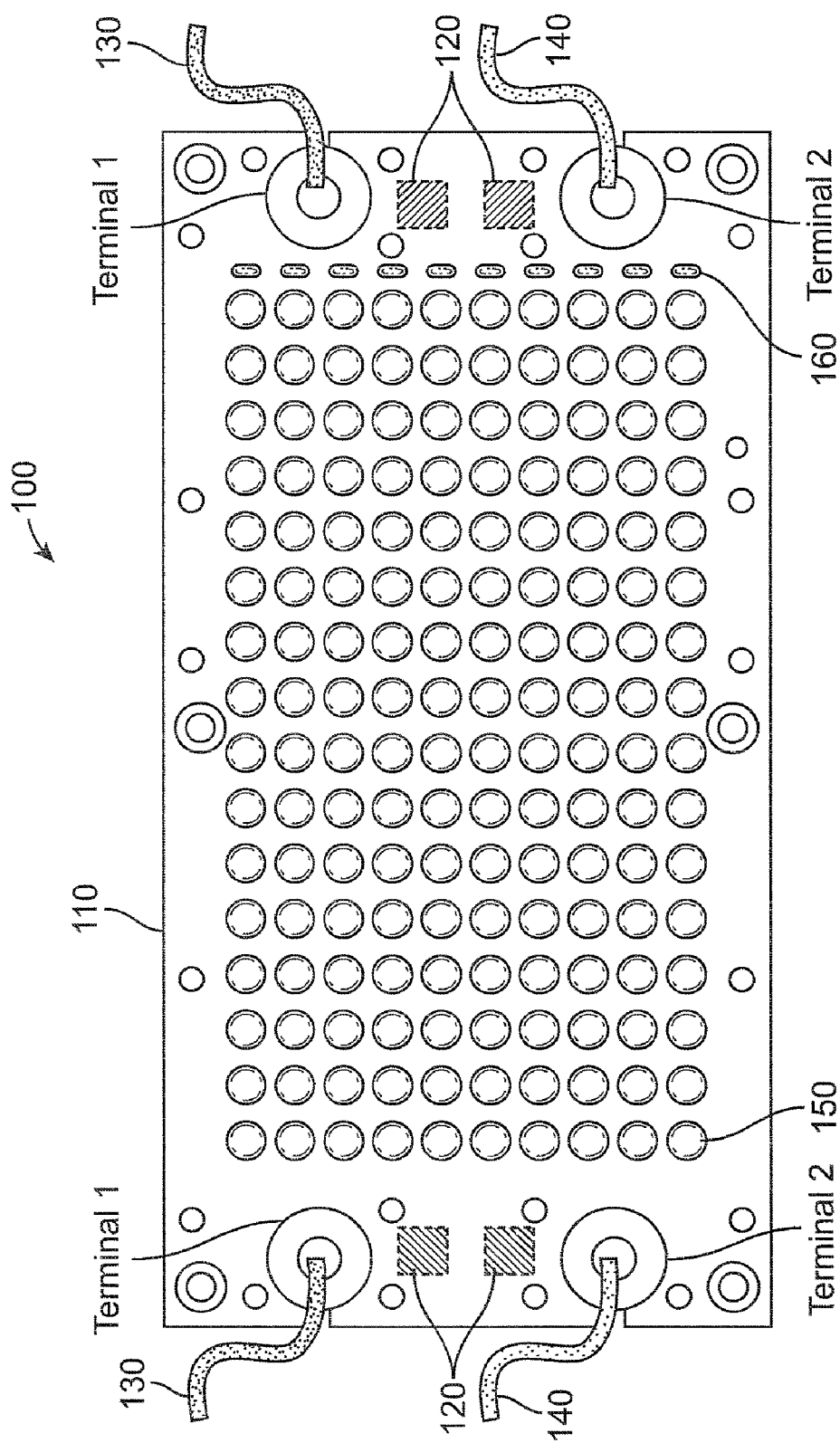
FIG. 1 illustrates a customizable chip-on-board (COB) Light Emitting Diode (LED) and a driver module(s) according to one embodiment of the invention.

FIG. 1 illustrates an embodiment of the invention including an integrated LED driver circuit 100. In one embodiment of the invention, the LED driver circuit 100 may be assembled as a COB or discrete packaged components. In one embodiment of the invention, the integrated LED driver circuit 100 includes a circuit board 110, LED IC drivers 120, first AC terminals 130, second AC terminals 140, LEDs 150, and protection diodes 160. In one embodiment of the invention, the LEDs are assembled as COB. The AC terminals 130 and 140 are configured to connect to an AC line voltage of 120V.

In one embodiment of the invention, the circuit board 110 is a metal core circuit board. In some embodiments of the invention, the LED IC drivers 120, first AC terminals 130, second AC terminals 140, LEDs 150, and protection diodes 160 are wire bonded without the use of pads or traces. In this embodiment of the invention, the circuit board 110 is directly connected to an AC line voltage such as 120 V AC without an external power supply.

In one embodiment of the invention, the plurality of LEDs 150 are treated with phosphor deposition and encapsulated. In this embodiment of the invention, the phosphor deposition treats blue LEDs to yield white lights.

Figure 4:
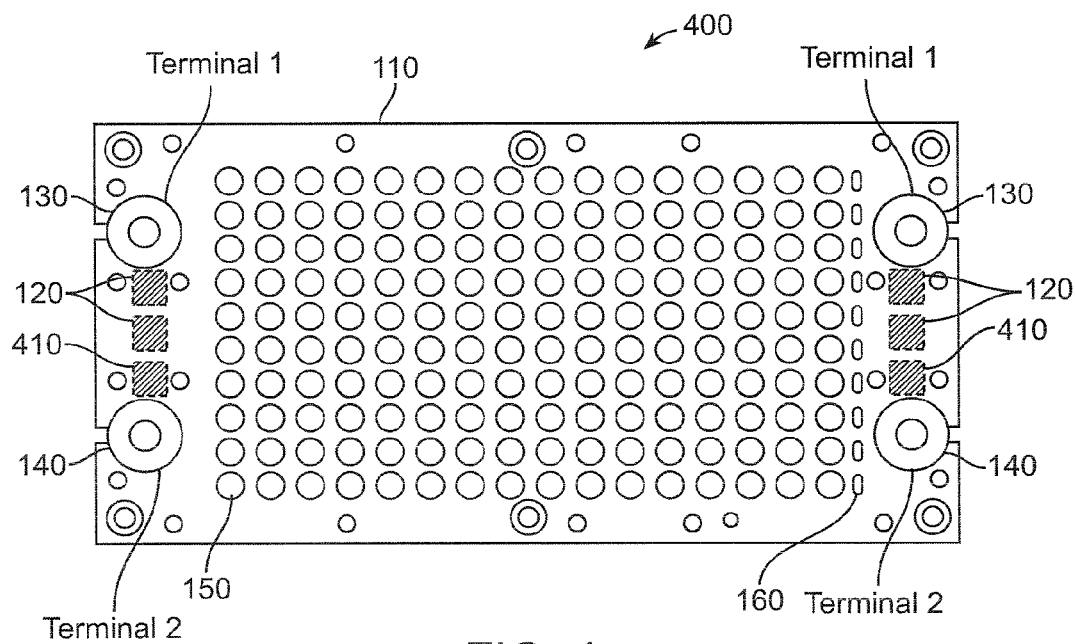
FIG. 4 illustrates a customizable COB LED, driver modules and a total harmonic distortion of current (THDi) circuit according to another embodiment of the invention.
Figure 5:
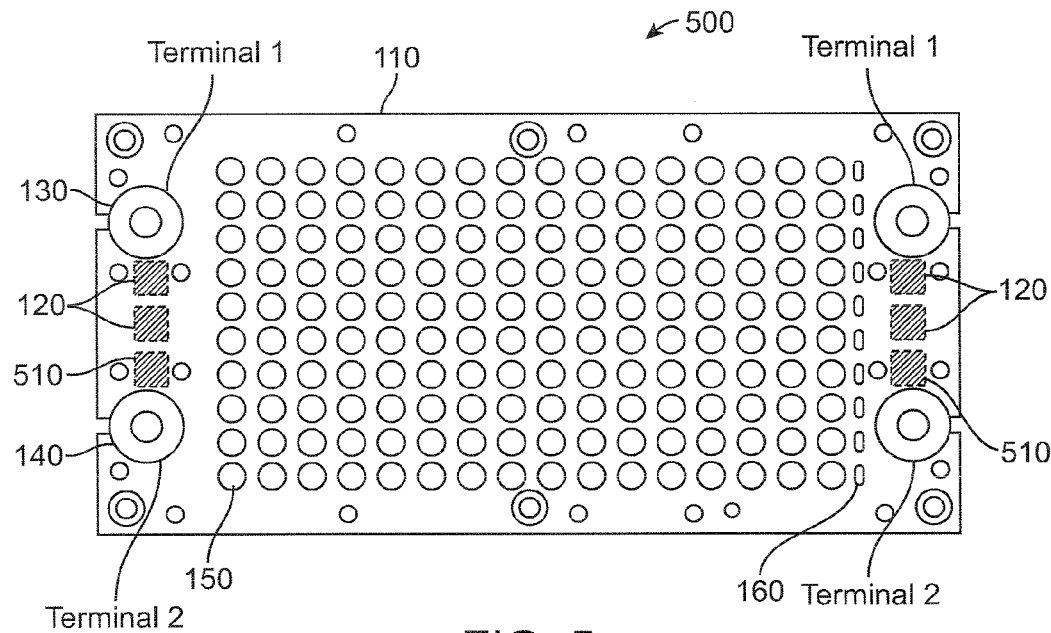
FIG. 5 illustrates a customizable COB LED, driver modules and a dimming circuit according to still another embodiment of the invention.

In one embodiment of the invention, the integrated LED driver circuit 100 further includes at least one total harmonic distortion of current (THDi) circuit 410 (see FIG. 4). In this embodiment of the invention, the THDi is maintained under 20%. In another embodiment of the invention, the integrated LED driver circuit 100 further includes a dimming circuit 510 (see FIG. 5). In one embodiment of the invention, the dimming circuit 510 is an IC LED driver circuit including an ENABLE pin for providing brightness control for dimming.

In these embodiments of the invention, combinations including THDi circuit(s) 410 and dimming circuit(s) 510 may also be configured. Some of the embodiments of the invention qualify for energy savings programs known as "green" programs due to the maintenance of THDi under 20% and also due to the dimming properties, which also save energy and reduces energy costs.

In one embodiment of the invention, the LED IC drivers 120 are high voltage, temperature compensated constant source of current when connected to an AC line voltage. In this embodiment of the invention, the LED IC drivers 120 is trimmed to provide a constant current of 20 mA±10% at an output voltage of 5.0-90V. In one embodiment of the invention, the LED IC drivers 120 are connected in parallel to provide higher currents, such as 40 mA, 60 mA or 80 mA. In one embodiment of the invention, the LED IC driver 120 has a 0.01%/° C. typical temperature coefficient and an operating junction temperature of −40° C. to +125° C.

Figure 2:
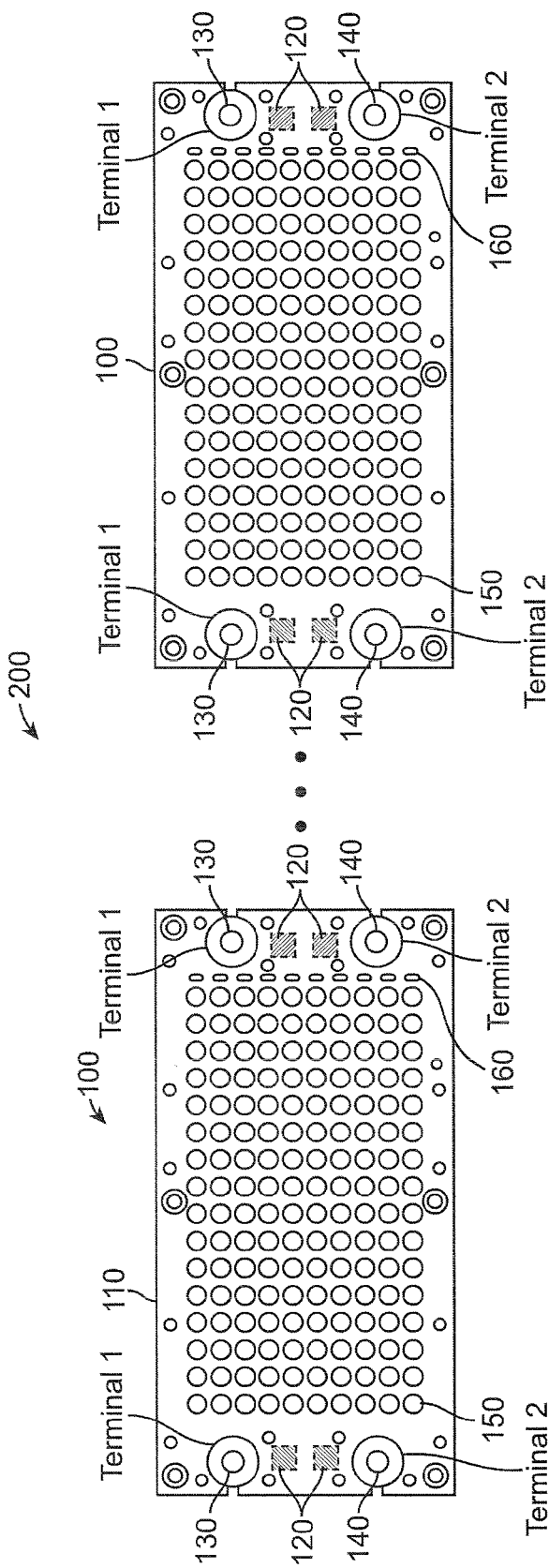
FIG. 2 illustrates a system of customizable COB LED and driver modules according to one embodiment of the invention.

FIG. 2 illustrates a system 200 including multiple integrated LED driver circuits 100 connected to one another. In this embodiment of the invention, the die of each LED driver circuits 100 can be placed directly next to one another so that light illuminating from the connected integrated LED driver circuits 100 appears continuous due to the wire bonding of the LED driver circuits 100.

Figure 3:
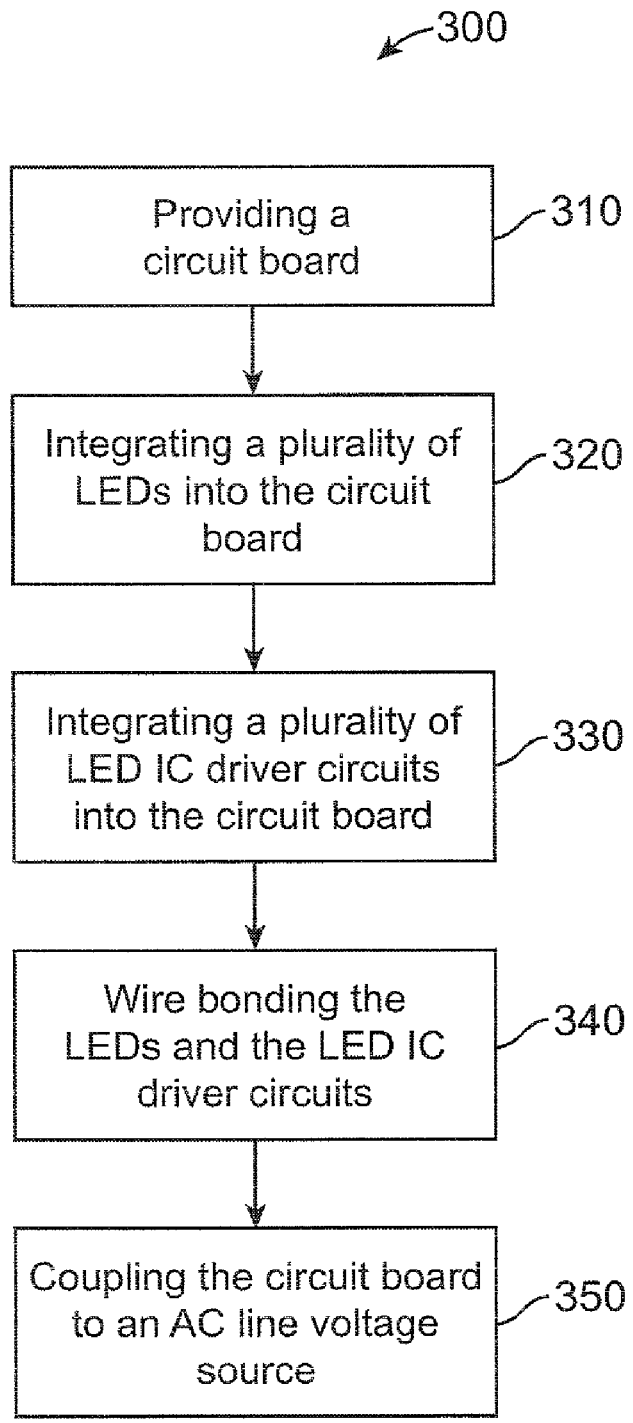
FIG. 3 illustrates a block diagram of a process according to one embodiment of the invention.

FIG. 3 illustrates a block diagram of a process 300 for an LED driving method. In block 310, a circuit board is provided, such as circuit board 110. In block 320, a plurality of LEDs (e.g., LEDs 150) are integrated to the circuit board. Process 300 continues with block 330 where a plurality of LED integrated circuit (IC) driver circuits are integrated with the circuit board (e.g., LED IC driver circuits 120). In block 340, the LEDs and the LED IC driver circuits are wire bonded to the circuit board. Process 300 continues with block 350 where the circuit board is connected to an AC line voltage source (e.g., 120V AC source).

In one embodiment of the invention, process 300 also includes coupling at least one THDi circuit to the circuit board and coupling at least one dimming circuit to the circuit board. In one embodiment of the invention, the process 300 provides a THDi of the circuit board less than 20%.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

The flowchart and block diagrams in the Figures illustrate the architecture, functionality, and operation of possible implementations of systems and methods according to various embodiments of the present invention. In this regard, each block in the flowchart or block diagrams may represent one or more modules, segments, steps, procedures, etc. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated Light Emitting Diode (LED) device comprising:
   a plurality of LEDs coupled to a circuit board;
   a first alternating current (AC) terminal and a second AC terminal coupled to the circuit board, the first and second AC terminals connected directly to a line voltage without an external power supply;
   one or more constant current sources connected to the first AC terminal and providing constant current to the plurality of LEDs over a range of voltage; and
   at least one total harmonic distortion of current (THDi) circuit.

2. The integrated LED device of claim 1, wherein THDi of the LED device is less than 20%.

3. The integrated LED device of claim 1, further comprising a dimming circuit.

4. The integrated LED device of claim 1, wherein the circuit board is wire bonded.

5. The integrated LED device of claim 1, wherein the plurality of LEDs are treated with phosphor deposition and encapsulated.

6. The integrated LED device of claim 1, wherein the line voltage is 120V.

7. The integrated LED device of claim 1, wherein the plurality of LED IC drivers are temperature compensated.

8. The integrated LED device of claim 1, wherein the circuit board has a metal core.

9. A Light Emitting Diode (LED) system comprising:
- a plurality of integrated circuit (IC) boards coupled to one another, each of the plurality of IC boards comprising:
  - a plurality of LEDs coupled to each IC board;
  - a first pair of alternating current (AC) terminals and a second pair of AC terminals coupled to each IC board, the first and second AC terminals connected directly to a line voltage without an external power supply; and,
  - one or more constant current sources connected to the first AC terminal and providing constant current to the plurality of LEDs over a range of voltage, wherein:
- a second pair of AC terminals of a first IC board couples with a first pair of AC terminals of a second IC board;
- each IC board further comprising at least one total harmonic distortion of current (THDi) circuit.

10. The LED system of claim 9, wherein THDi of the system is less than 20%.

11. The LED system of claim 9, wherein each IC board further comprising at least one dimming circuit.

12. The LED system of claim 9, wherein each IC board is wire bonded.

13. The LED system of claim 9, wherein the plurality of LEDs are treated with phosphor deposition and encapsulated.

14. The LED system of claim 9, wherein the LED system is directly coupled to a line voltage without an external power supply.

15. The LED system of claim 14, wherein the line voltage is 120V.

16. The LED system of claim 9, wherein the plurality of LED IC drivers are temperature compensated.

17. A Light Emitting Diode (LED) driving method comprising:
- providing a circuit board;
- integrating a plurality of LEDs to the circuit board;
- integrating a first alternating current (AC) terminal and a second AC terminal coupled to the circuit board, the first and second AC terminals connected directly to a line voltage without an external power supply;
- integrating one or more constant current sources connected to the first AC terminal and providing constant current to the plurality of LEDs over a range of voltage;
- wire bonding the LEDs and the constant current sources;
- coupling the circuit board to an AC line voltage source; and,
- coupling at least one total harmonic distortion of current (THDi) circuit to the circuit board.

18. The LED driving method of claim 17, further comprising:
- coupling at least one dimming circuit to the circuit board.

19. The LED driving method of claim 18, wherein THDi of the circuit board is less than 20%.

* * * * *